US012740417B2

(12) United States Patent
Thapa et al.

(10) Patent No.: US 12,740,417 B2
(45) Date of Patent: Sep. 15, 2026

(54) APPARATUS, SYSTEM, AND METHOD FOR MITIGATING WARPAGE IN INTEGRATED CIRCUIT PACKAGES

(71) Applicants: Advanced Micro Devices, Inc., Santa Clara, CA (US); ATI Technologies ULC, Markham (CA)

(72) Inventors: Resham Raj Thapa, Austin, TX (US); Xiao Ling Shi, Markham (CA); Farshad Ghahghahi, Santa Clara, CA (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 679 days.

(21) Appl. No.: 17/957,514

(22) Filed: Sep. 30, 2022

(65) Prior Publication Data

US 2025/0157946 A1 May 15, 2025

(51) Int. Cl.
*H10W 42/00* (2026.01)

(52) U.S. Cl.
CPC ................................ *H10W 42/121* (2026.01)

(58) Field of Classification Search
None
See application file for complete search history.

(56) References Cited

U.S. PATENT DOCUMENTS 8,986,806 B1 * 3/2015 Baloglu ............ H01L 23/49833 428/81
2022/0028800 A1 * 1/2022 Chen ....................... H01L 23/16

* cited by examiner

*Primary Examiner* — Bo B Jang
(74) *Attorney, Agent, or Firm* — Greenberg Traurig, LLP

(57) ABSTRACT

An exemplary stiffener comprises an inner perimeter that substantially surrounds at least one dimension of an integrated circuit coupled to a substrate. The inner perimeter of stiffener comprises a set of boundaries and at least one recess formed into at least one of the boundaries. In addition, the exemplary stiffener also comprises an outer perimeter that extends further outward from the integrated circuit than the inner perimeter. Various other apparatuses, systems, and methods are also disclosed.

20 Claims, 7 Drawing Sheets

Outer Perimeter 104

Components 416(2)

Corner 418(2)

Components 416(3)

Inner Perimeter 102

Corner 418(1)

Integrated Circuit 404

Corner 418(3)

Keep-Out Zone 412

Stiffener 300

Components 416(1)

Corner 418(4)

Components 416(4)

APPARATUS, SYSTEM, AND METHOD FOR MITIGATING WARPAGE IN INTEGRATED CIRCUIT PACKAGES

BACKGROUND

Integrated circuit (IC) packages can be susceptible to warpage during assembly, soldering, and/or operation. For example, warpage can occur due to different coefficients of thermal expansion (CTEs) between the silicon and package buildup layers. Unfortunately, warpage can bend an IC package such that permanent connection joints are unable to form and/or persist at certain points and/or terminals within the IC package and/or between the IC package and the corresponding circuit board. Minimizing such warpage can be critical to reliable device operation of the ICs. The instant disclosure, therefore, identifies and addresses a need for additional and improved apparatuses, systems, and methods for mitigating warpage in IC packages.

BRIEF DESCRIPTION OF THE DRAWINGS

The accompanying drawings illustrate a number of exemplary implementations and are a part of the specification. Together with the following description, these drawings demonstrate and explain various principles of the instant disclosure.

Figure 1:
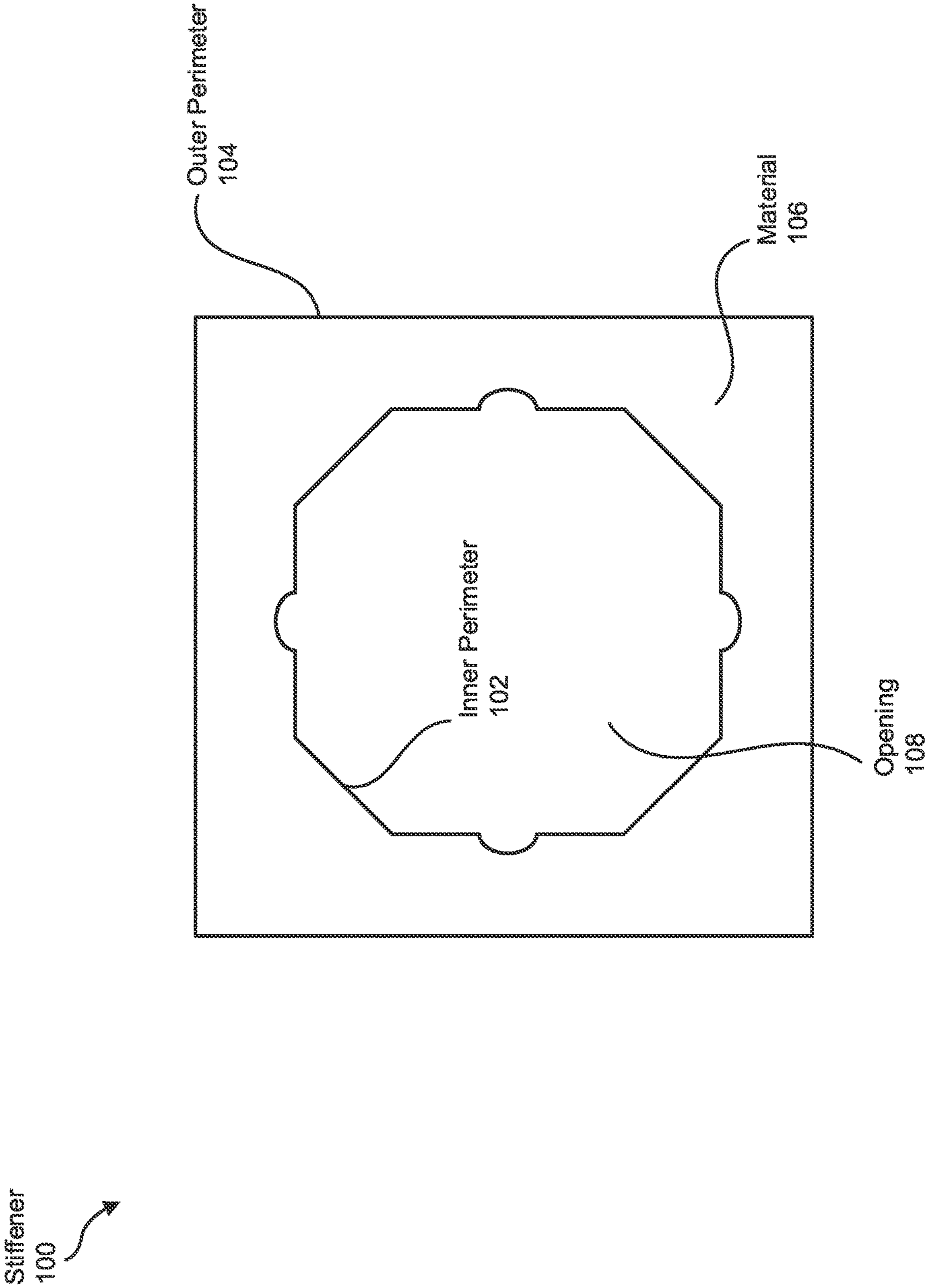
FIG. 1 is an illustration of an exemplary stiffener for mitigating warpage in IC packages according to one or more implementations of this disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the instant disclosure covers all modifications, equivalents, and alternatives falling within the scope of the appended claims.

DETAILED DESCRIPTION OF EXEMPLARY IMPLEMENTATIONS

The present disclosure describes various apparatuses, systems, and methods for mitigating warpage in IC packages. In some examples, warpage can be mitigated by applying a stiffener (e.g., a stiffener ring and/or brace) to a substrate supporting a silicon die within an IC package. Unfortunately, in certain smaller package form factors, the application of stiffener rings has been challenging and/or avoided due at least in part to tighter spaces around the IC die and/or the corresponding keep-out zones.

For example, in smaller packages, the space necessary for component placements is limited. To increase and/or improve the amount of space available for component placements in such packages, the IC die can be rotated and/or skewed one way or another relative to the sides of the substrate. However, this rotated and/or skewed die orientation and/or configuration can cause the corners of the die to sit and/or reside very close to the area reserved for the stiffener. Moreover, the dimensions of the corresponding keep-out zone typically remain the same even as the overall package size decreases. As a result, there is a need for accommodating the corners of the IC die relative to the keep-out zone within the package, especially as the overall size decreases in rotated die packages.

As will be described in greater detail below, an exemplary stiffener ring design can include and/or form small curved recesses (e.g., similar to a "C" shape) proximate to the four corners of a silicon die within an IC package. In some examples, such recesses can each have a radius of curvature between 1 and 5 millimeters. In one example, due to the relatively smaller width of the stiffener ring at the curved position compared to non-curved positions, the adhesive pattern for the stiffener ring can be changed from a continuous rectangular pattern to four discontinuous "L" shapes to minimize the risk of the adhesive bleeding into the keep-out zone situated between the stiffener ring and the IC die.

In some examples, a stiffener comprises an inner perimeter that substantially surrounds at least one dimension of an IC coupled to a substrate. In one example, the inner perimeter comprises a set of boundaries and at least one recess formed into at least one of the boundaries. In this example, the stiffener also comprises an outer perimeter that extends further outward from the IC than the inner perimeter.

In some examples, the stiffener comprises material that extends between the inner perimeter and the outer perimeter. In such examples, this material provides structural support to the substrate to impede the substrate and/or the IC from warping.

In some examples, the inner perimeter is positioned to substantially align the recess with at least one corner of the IC. In one example, the set of boundaries comprises at least four linear boundaries that collectively form the inner perimeter. Additionally or alternatively, the set of boundaries comprises eight linear boundaries that collectively form the inner perimeter.

In some examples, the inner perimeter comprises a certain number of recesses, and the IC comprises a certain number of corners that is equivalent to the certain number of recesses. Additionally or alternatively, the inner perimeter comprises a certain number of recesses, and the set of boundaries comprises a different number of linear boundaries that is equivalent to double the certain number of recesses. In one example, the set of boundaries are arranged in a symmetrical configuration.

In some examples, the inner perimeter comprises a first recess formed into a first linear boundary included in the set of boundaries. In such examples, the inner perimeter also comprises a second recess formed into a second linear boundary that is included in the set of boundaries and positioned opposite the linear boundary. In one example, the first recess and the second recess are offset from one another relative to a symmetry axis that bisects the inner perimeter.

In some examples, the inner perimeter comprises a third recess formed into a third linear boundary included in the set of boundaries. In such examples, the inner perimeter also comprises a fourth recess formed into a fourth linear boundary that is included in the set of boundaries and positioned opposite the third linear boundary. In one example, the third recess and the fourth recess are offset from one another relative to the symmetry axis. Additionally or alternatively, one or more of the recesses comprises a curved radius.

The following will provide, with reference to FIGS. 1-6, detailed descriptions of exemplary apparatuses, devices, systems, and/or corresponding implementations for mitigating warpage in IC packages. Detailed descriptions of an exemplary method for mitigating warpage in IC packages will be provided in connection with FIG. 7.

FIG. 1 shows an exemplary stiffener 100 that mitigates warpage in IC packages. As illustrated in FIG. 1, exemplary stiffener 100 includes and/or represents an inner perimeter 102 and/or an outer perimeter 104. In some examples, stiffener 100 includes and/or represents material 106 that extends from inner perimeter 102 and outer perimeter 104. In such examples, material 106 of stiffener 100 is configured to provide, offer, and/or supply structural support to a substrate.

In some examples, inner perimeter 104 includes and/or represents a set of boundaries and/or one or more recesses formed and/or created in one or more of those boundaries. In one example, stiffener 100 is configured to form, create, and/or provide an opening 108 for an IC (not necessarily illustrated in FIG. 1). In other words, stiffener 100 can be placed and/or positioned such that inner perimeter 104 substantially surrounds all or part of the IC via opening 108. In this example, outer perimeter 104 extends further outward from the IC than inner perimeter 102.

In some examples, stiffener 100 includes and/or represents any type or form of physical material, structure, and/or support feature that fastens, couples, and/or adheres to part of an IC package (e.g., a substrate). In one example, stiffener 100 includes and/or represents a ring and/or brace that is fixed to the top surface and/or side surface of a substrate that supports an IC die (e.g., a lidless IC). In this example, stiffener 100 can at least partially surround the die (e.g., silicon) of the IC.

Stiffener 100 can include and/or form any suitable shape. In some examples, stiffener 100 can form a square, a circle, and/or a rectangle (e.g., a non-square rectangle). Additional examples of shapes formed by stiffener 100 include, without limitation, triangles, pentagons, hexagons, octagons, ovals, diamonds, parallelograms, combinations or variations of one or more of the same, and/or any other suitable shapes.

In addition, stiffener 100 can be of any suitable dimensions. In one example, stiffener 100 can encompass and/or extend beyond the perimeter of the substrate to which the IC die is coupled. Stiffener 100 can include and/or contain any of a variety of materials. Examples of such materials include, without limitation, plastics, ceramics, polymers, metals, composites, combinations or variations of one or more of the same, and/or any other suitable materials.

In some examples, stiffener 100 can serve as a foundation and/or base that provides structural support, tension, strength, and/or integrity to the IC, substrate, and/or package. In one example, stiffener 100 is placed, positioned, secured, and/or coupled to the substrate prior to a reflow process in which the bottom surface of the IC package is soldered to a circuit board. After placement, stiffener 100 can provide structural support and/or strength to the IC, substrate, and/or package. By providing structural support and/or strength in this way, stiffener 100 can impede and/or prevent the IC, substrate, and/or package from warping during the reflow process and/or subsequent operation.

Figure 2:
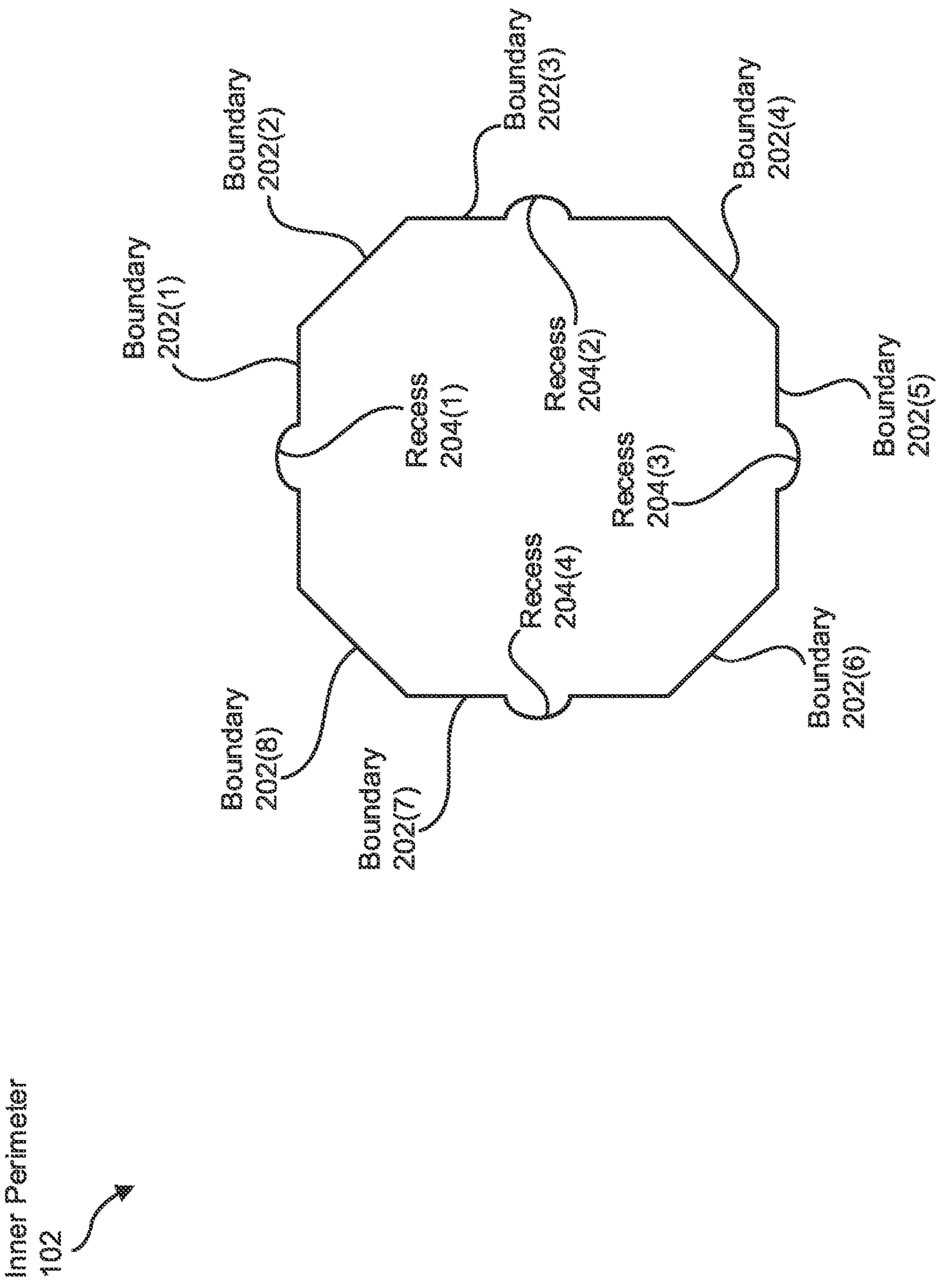
FIG. 2 is an illustration of an exemplary inner perimeter of a stiffener for mitigating warpage in IC packages according to one or more implementations of this disclosure.

FIG. 2 illustrates an exemplary representation and/or implementation of inner perimeter 102 on stiffener 100. As illustrated in FIG. 2, exemplary inner perimeter 102 on stiffener 100 can include a set of boundaries 202(1), 202(2), 202(3), 202(4), 202(5), 202(6), 202(7), and/or 202(8) dimensioned to substantially surround an IC die. In some examples, inner perimeter 102 can include and/or represent certain components and/or features that perform and/or provide functionalities that are similar and/or identical to those described above in connection with FIG. 1. In one example, each of boundaries 202(1)-(8) can include and/or represent an inner portion of material designed and/or intended for placement around and/or proximate to the perimeter of the IC die. Additionally or alternatively, boundaries 202(1)-(8) can include and/or represent linear borders and/or sides of opening 108.

In some examples, one or more of boundaries 202(1)-(8) include and/or incorporate recesses dimensioned to accommodate additional spacing for one or more corners of an IC die placed and/or positioned within the opening 108 of stiffener 100. For example, boundaries 202(1), 202(3), 202(5), and 202(7) include, form, and/or define recesses 204(1), 204(2), 204(3), and 204(4), respectively. In one example, stiffener 100 is placed and/or positioned to substantially align recesses 204(1)-(4) with corners of the IC die. Additionally or alternatively, recesses 204(1)-(4) can each have, include, and/or form a curved radius that juts, projects, and/or extends outward toward outer perimeter 104 from boundaries 202(1), 202(3), 202(5), and 202(7), respectively.

In some examples, boundaries 202(1)-(8) can form, establish, and/or be arranged in a symmetrical configuration and/or shape. Additionally or alternatively, recesses 204(1) and 204(3) can be positioned substantially opposite one another within stiffener 100. Similarly, recesses 204(2) and 204(4) can be positioned substantially opposite one another within stiffener 100.

Figure 3:
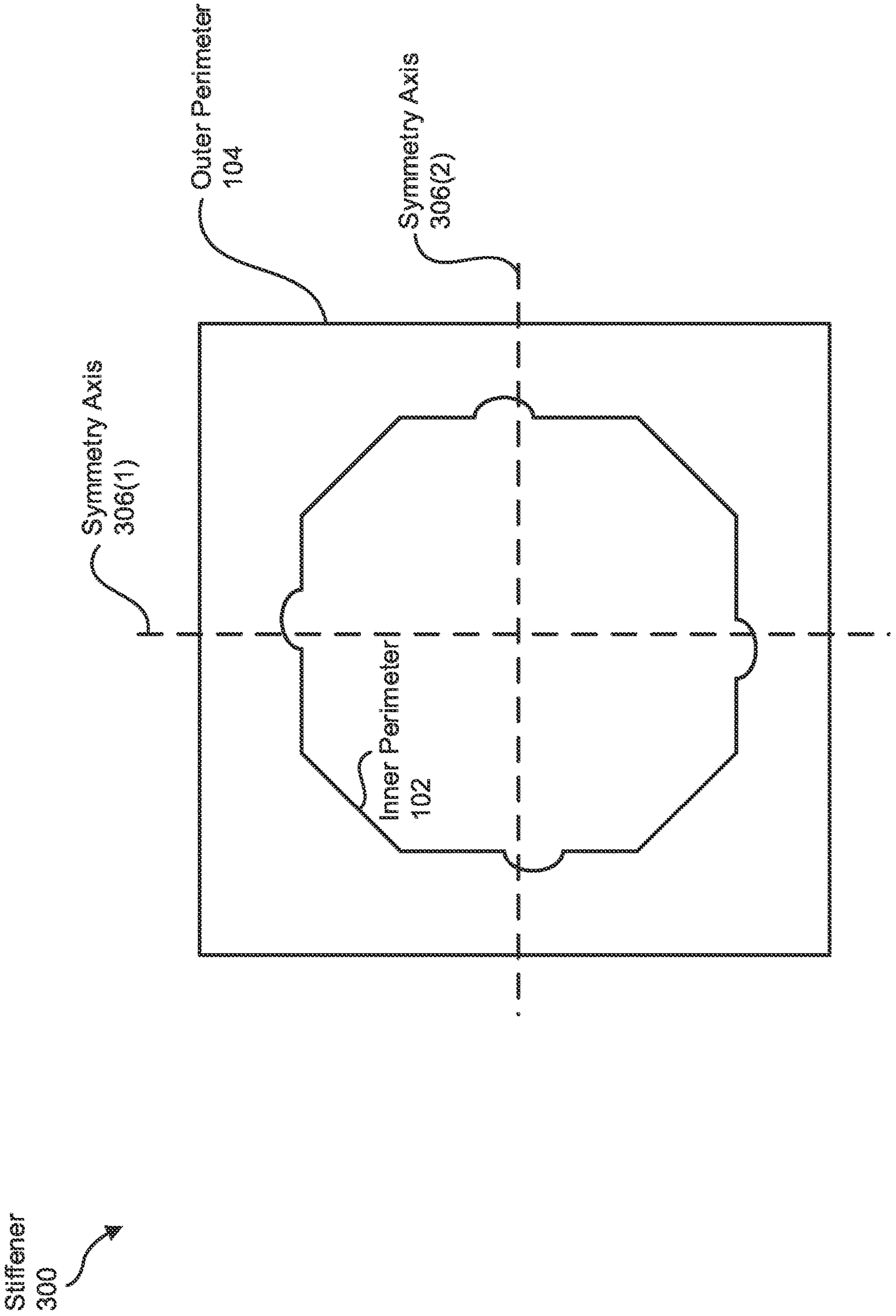
FIG. 3 is an illustration of an exemplary stiffener for mitigating warpage in IC packages according to one or more implementations of this disclosure.

FIG. 3 shows an exemplary stiffener 300 that mitigates warpage in IC packages. As illustrated in FIG. 3, exemplary stiffener 300 includes and/or represents an inner perimeter 102 and/or an outer perimeter 104. In some examples, stiffener 300 can include and/or represent certain components and/or features that perform and/or provide functionalities that are similar and/or identical to those described above in connection with FIGS. 1 and 2. In one example, stiffener 300 can have, include, and/or form symmetry axes 306(1) and 306(2) that intersect and/or run perpendicular to one another. In this example, symmetry axis 306(1) or 306(2) can virtually bisect and/or divide inner perimeter 102 and/or stiffener 300 such that the constituent parts are similar and/or identical to one another (albeit potentially mirrored and/or flipped relative to one another).

In certain examples, some of recesses 204(1)-(4) are offset and/or shifted from one another relative to symmetry axis 306(1) or 306(2). For example, recesses 204(1) and 204(3) are positioned offset and/or slightly shifted from one another relative to symmetry axis 306(2). In another example, recesses 204(2) and 204(4) are positioned offset and/or slightly shifted from one another relative to symmetry axis 306(1).

Figure 4:
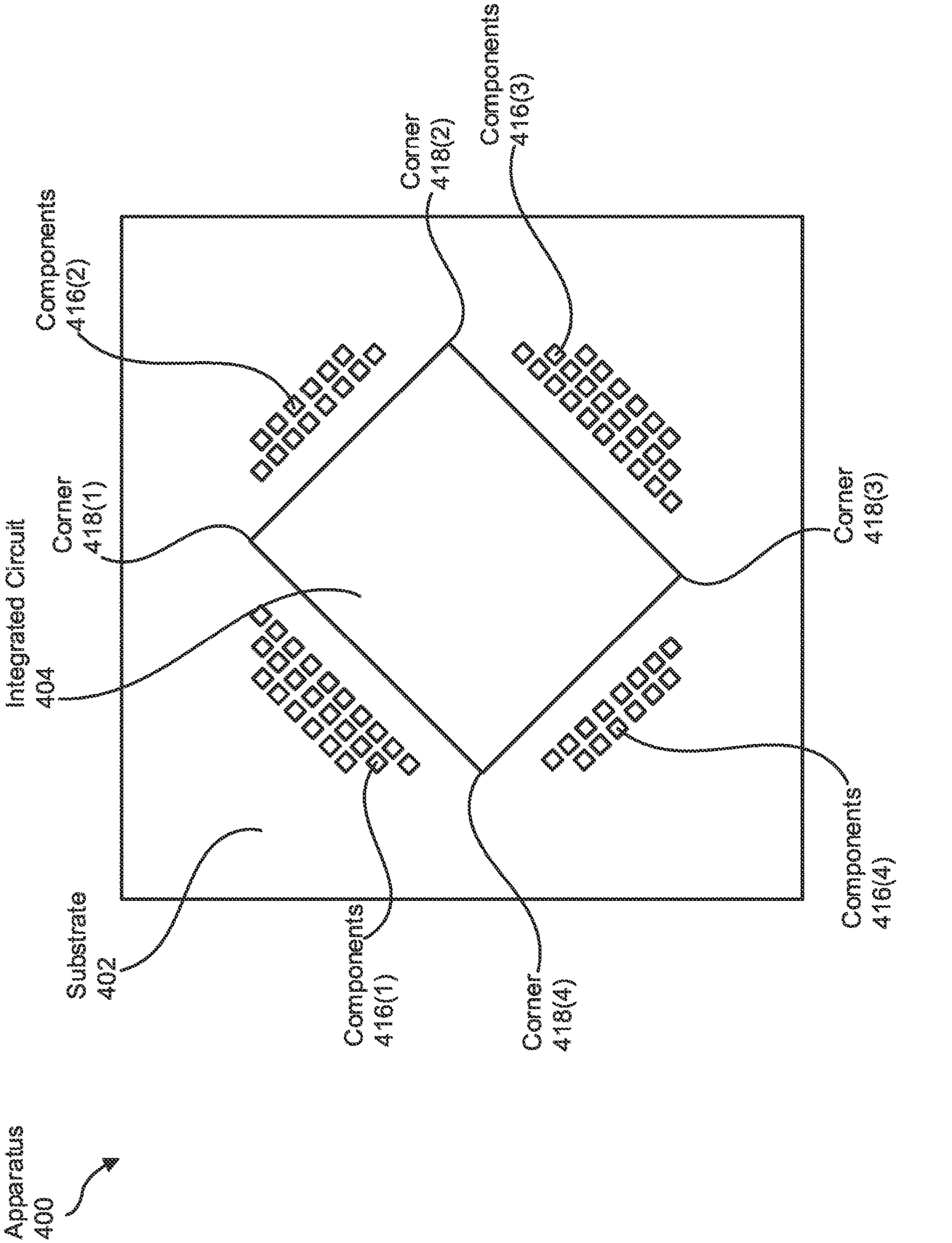
FIG. 4 is an illustration of an exemplary apparatus that is potentially susceptible to warpage according to one or more variations of this disclosure.

FIG. 4 illustrates certain portions of an exemplary apparatus 400 whose risk of and/or potential for warpage is mitigated by the application of stiffener 100 or 300. As illustrated in FIG. 4, exemplary apparatus 400 includes and/or represents a substrate 402, an IC 404, and components 416(1), 416(2), 416(3), and 416(4). In some examples, apparatus 400 can include and/or represent certain components and/or features that perform and/or provide functionalities that are similar and/or identical to those described above in connection with FIGS. 1-3. In one example, apparatus 400 can include and/or represent a rotated die orientation and/or configuration in which IC 404 is rotated and/or skewed relative to the sides of substrate 402.

In some examples, IC 404 and components 416(1)-(4) are set, coupled, and/or soldered to substrate 402. In one example, IC 404 is positioned and/or placed diagonally atop substrate 402 such that corners 418(1), 418(2), 418(3), and 418(4) of IC 404 substantially align with the recesses of a stiffener (not necessarily illustrated in FIG. 4) that is subsequently coupled and/or applied to substrate 402. Additionally or alternatively, components 416(1)-(4) can be positioned and/or arranged for placement inside opening 108 but outside the corresponding keep-out zone when the stiffener is coupled and/or applied to substrate 402.

In some examples, substrate 402 can include and/or represent a die and/or piece of semiconductor material (such as silicon, germanium, and/or gallium arsenide). In other examples, substrate 402 can include and/or represent a die and/or piece of electrical insulator material (such as silicon dioxide, sapphire, aluminum oxide, polymers, and/or ceramics). In one example, substrate 402 can include and/or represent multiple layers of insulation materials. In this example, substrate 402 can also include and/or represent copper traces and/or through-silicon vias that route signals from the silicon to connection terminals and/or leads on the bottom of the corresponding IC package.

In some examples, IC 404 includes and/or represents a small, diced die and/or piece of semiconductor material. For example, IC 404 can include and/or represent a silicon wafer. In this example, IC 404 can include and/or contain one or more circuits that consist of various electrical and/or electronic components (such as resistors, capacitors, and/or transistors). Such circuits can be etched, deposited, implanted, and/or fabricated onto IC 404.

Although illustrated as a single unit in FIG. 4, IC 404 can alternatively include and/or represent multiple dies attached to substrate 402. In one example, all the dies can be located and/or positioned within and/or inside the opening of the corresponding stiffener. In another example, such dies may be stacked together (using, e.g., a "through-silicon vias" technique) and then attached to substrate 402 as a stack. In a further example, a silicon interposer may be attached to substrate 402 first, after which IC 404 and/or other components may be attached to the silicon interposer.

In some examples, components 416(1)-(4) can include and/or represent various devices, electronics, and/or electrical elements. For example, components 416(1)-(4) can include and/or represent analog and/or digital circuitry, onboard logic, transistors, resistors, capacitors, diodes, inductors, switches, registers, flipflops, processors, connections, traces, buses, semiconductor (e.g., silicon) devices and/or structures, storage devices, circuit boards, housings, combinations or variations of one or more of the same, portions of one or more of the same, and/or any other suitable components.

Figure 5:
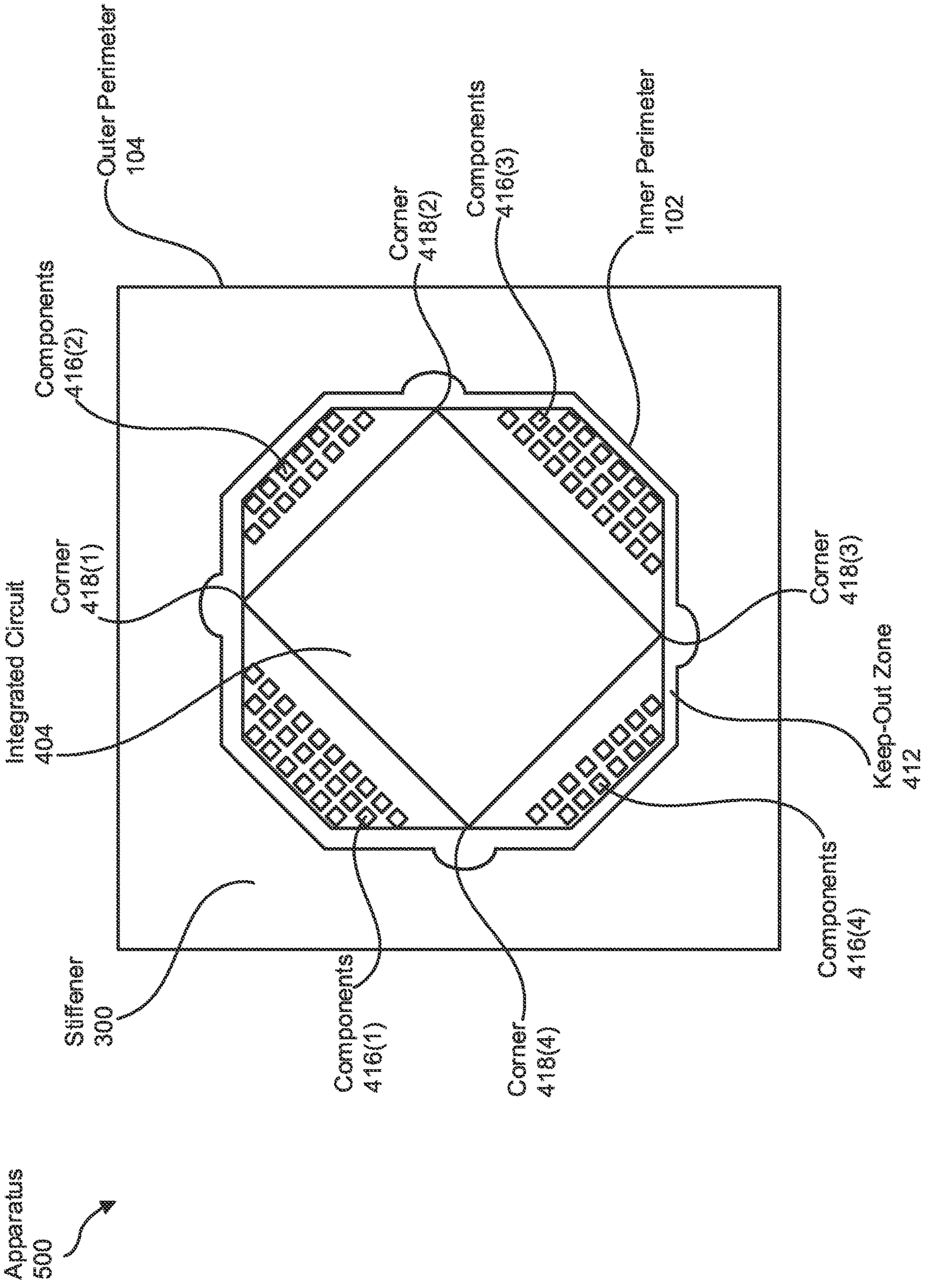
FIG. 5 is an illustration of an exemplary apparatus capable of mitigating and/or withstanding warpage according to one or more implementations of this disclosure.

FIG. 5 illustrates an exemplary apparatus 500 capable of mitigating and/or withstanding warpage. As illustrated in FIG. 5, exemplary apparatus 500 includes and/or represents substrate 402, IC 404, components 416(1)-(4), and/or stiffener 300. In some examples, apparatus 500 can include and/or represent certain components and/or features that perform and/or provide functionalities that are similar and/or identical to those described above in connection with FIGS. 1-4.

In some examples, IC 404, components 416(1)-(4), and/or stiffener 300 are coupled, attached, and/or secured to or atop substrate 402. In such examples, stiffener 300 substantially surrounds at least one dimension (e.g., length, width, height, a horizontal plane, etc.) of IC 404. In one example, stiffener 300 is positioned and/or placed to substantially align recesses 204(1)-(4) with corners 418(1)-(4) of IC 404.

In one example, the number of recesses formed in the boundaries of stiffener 300 matches and/or coincides with the number of corners on IC 404. Additionally or alternatively, the number of recesses formed in stiffener 300 is less than (e.g., equivalent to half) the number of boundaries included in the inner perimeter of stiffener 300. Put differently, the number of boundaries included in the inner perimeter of stiffener 300 can be more than (e.g., equivalent to double) the number of recesses formed in stiffener 300.

In some examples, stiffener 300 can mitigate, reduce, and/or minimize warpage to substrate 402, IC 404, and/or the corresponding package. In such examples, the design of stiffener 300 can also combat and/or mitigate the challenge of applying and/or inserting a stiffener into the tight spacing and/or limited tolerances of small IC packages. For example, the design of stiffener 300 can enable and/or support all of IC 404 and components 416(1)-(4) to fit within opening 108 but outside a keep-out zone 412. In this example, keep-out zone 412 can include and/or represent an area within opening 108 where all devices, components, and/or features are restricted for reliability and/or consistency purposes.

Figure 6:
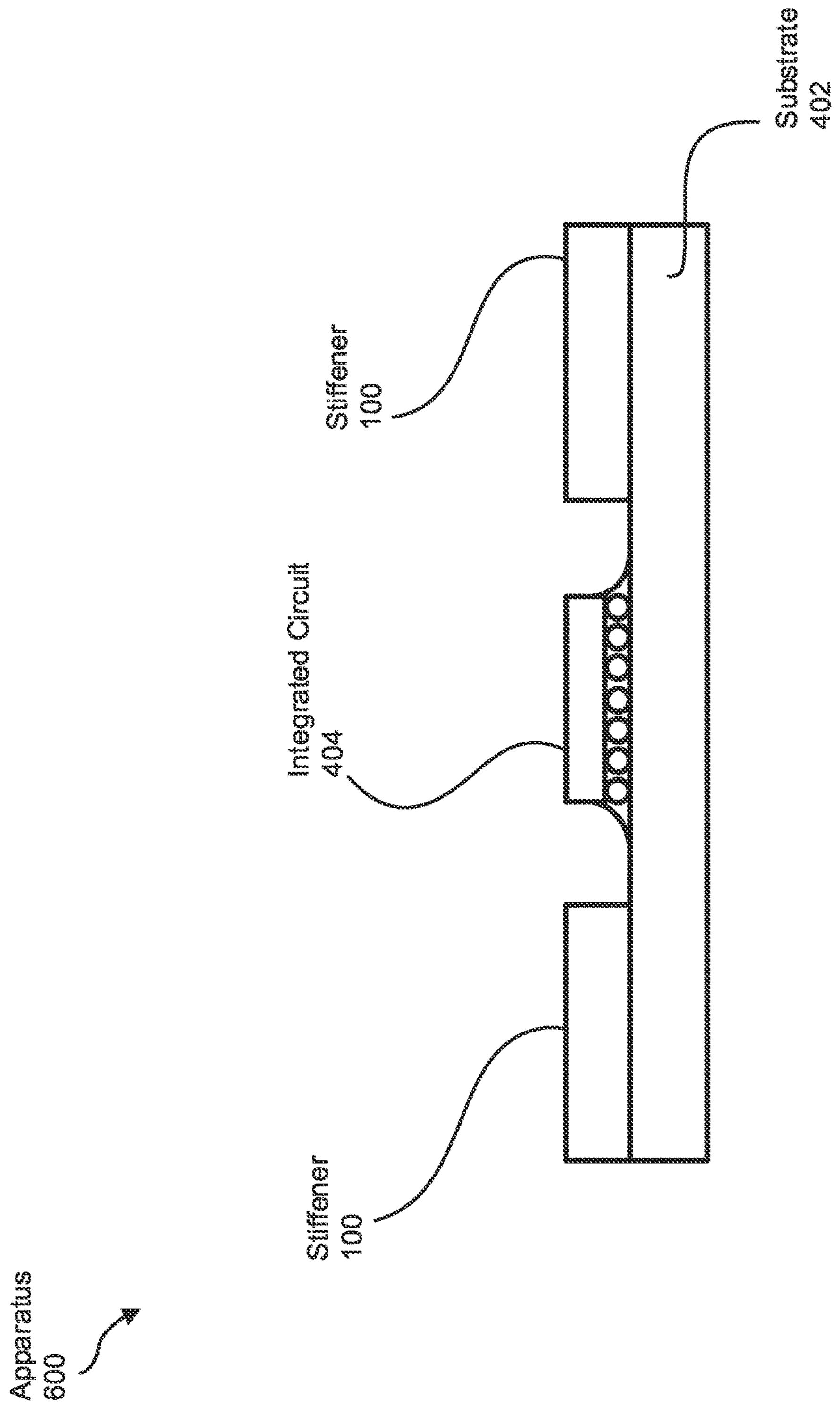
FIG. 6 is an illustration of an exemplary apparatus capable of mitigating and/or withstanding warpage according to one or more implementations of this disclosure.

FIG. 6 illustrates a cross section of an exemplary apparatus 600 capable of mitigating and/or withstanding warpage. As illustrated in FIG. 6, exemplary apparatus 600 includes and/or represents substrate 402, IC 404, and/or stiffener 100. In some examples, IC 404 can be secured, coupled, and/or soldered to substrate 402. In these examples, stiffener 100 can be fastened, attached, coupled, and/or adhered to substrate 402. Such couplings and/or attachments can be accomplished by various means, including adhesives, glue, cement, mortar, putty, solder, tape, combinations or variations of one or more of the same, and/or any other suitable attachment means.

Figure 7:
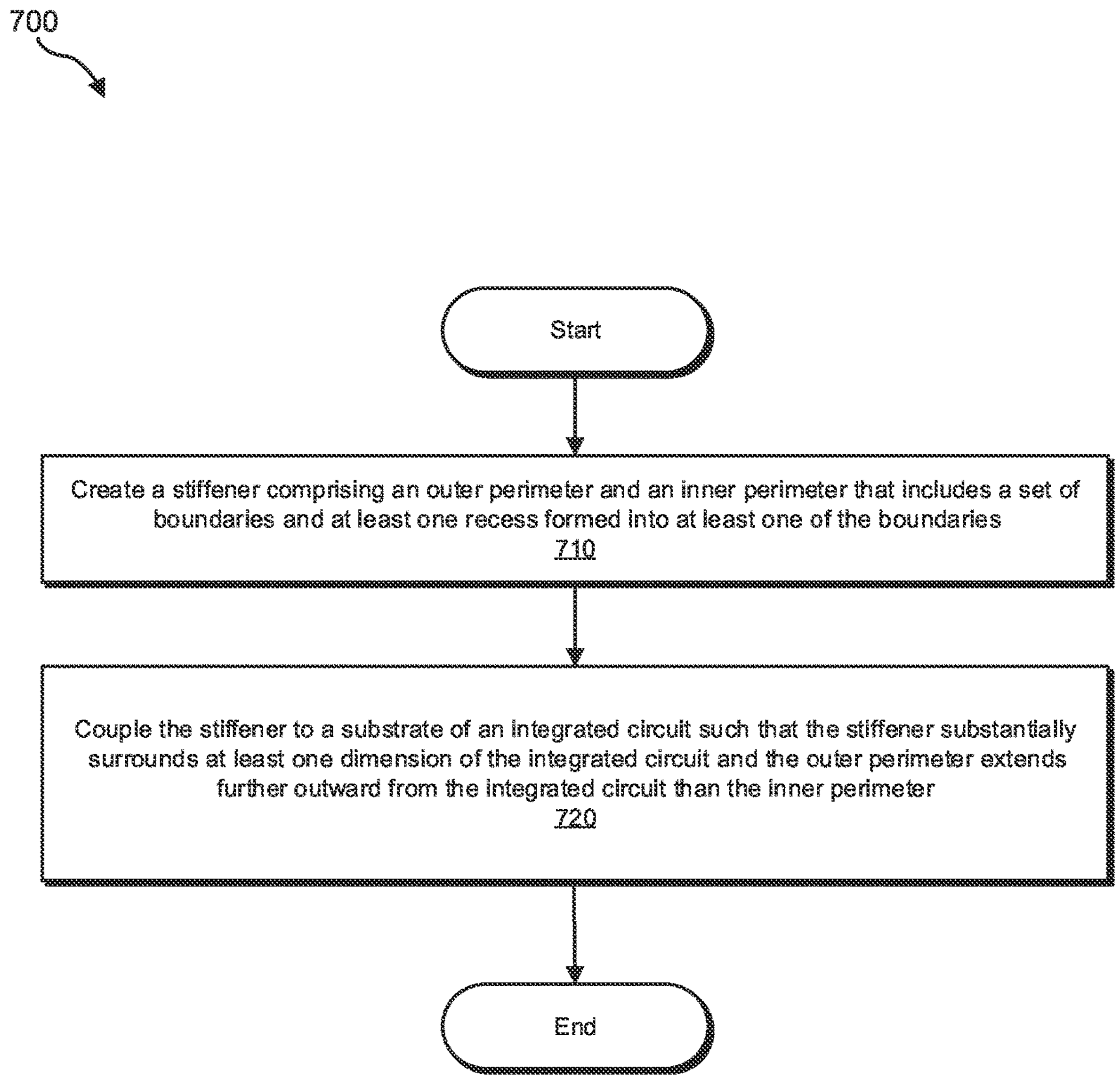
FIG. 7 is a flowchart of an exemplary method for mitigating warpage in IC packages according to one or more implementations of this disclosure.

FIG. 7 is a flow diagram of an exemplary method 700 for mitigating warpage in IC packages. In one example, the steps shown in FIG. 7 can be performed and/or executed in connection with the manufacturing, assembly, and/or creation of a stiffener and/or an IC package. Additionally or alternatively, the steps shown in FIG. 7 can also incorporate and/or involve various sub-steps and/or variations consistent with the descriptions provided above in connection with FIGS. 1-6.

As illustrated in FIG. 7, exemplary method 700 include and/or involve the step of creating a stiffener that comprises an outer perimeter and an inner perimeter that includes a set of boundaries and at least one recess formed into at least one of the boundaries (710). Step 710 can be performed in a variety of ways, including any of those described above in connection with FIGS. 1-6. For example, an IC manufacturer or subcontractor can create, manufacture, and/or build a stiffener that comprises an outer perimeter and an inner perimeter that includes a set of boundaries and at least one recess formed into at least one of the boundaries Exemplary method 700 also includes the step of coupling the stiffener to a substrate of an IC such that the stiffener substantially surrounds at least one dimension of the IC and the outer perimeter extends further outward from the IC than the inner perimeter (720). Step 720 can be performed in a variety of ways, including any of those described above in connection with FIGS. 1-6. For example, the IC manufacturer or subcontractor can couple, attach, and/or adhere the stiffener to a substrate of an IC such that the stiffener substantially surrounds at least one dimension of the IC and the outer perimeter extends further outward from the IC than the inner perimeter.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality. Furthermore, the various steps, events, and/or features performed by such components should be considered exemplary in nature since many alternatives and/or variations can be implemented to achieve the same functionality within the scope of this disclosure.

The process parameters and sequence of the steps described and/or Illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the instant disclosure. The implementations disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A stiffener comprising:
- an inner perimeter comprising a polygonal shape that surrounds at least one dimension of an integrated circuit coupled to a substrate, the inner perimeter comprising:
  - sides of the polygonal shape creating a set of boundaries; and
  - at least one recess formed into at least one boundary of the set of boundaries, wherein the at least one recess comprises a curved radius; and
- an outer perimeter that extends further outward from the integrated circuit than the inner perimeter.

2. The stiffener of claim 1, further comprising material that:
- extends between the inner perimeter and the outer perimeter; and
- provides structural support to the substrate to impede the substrate or the integrated circuit from warping.

3. The stiffener of claim 1, wherein the inner perimeter is positioned to align the at least one recess with at least one corner of the integrated circuit.

4. The stiffener of claim 1, wherein the set of boundaries comprises at least four linear boundaries that collectively form the inner perimeter.

5. The stiffener of claim 1, wherein the set of boundaries comprises eight linear boundaries that collectively form the inner perimeter.

6. The stiffener of claim 1, wherein:
- the at least one recess comprises a certain number of recesses; and
- the integrated circuit comprises a certain number of corners that is equivalent to the certain number of recesses.

7. The stiffener of claim 1, wherein:
- the at least one recess comprises a certain number of recesses; and
- the set of boundaries comprises a different number of linear boundaries that is equivalent to double the certain number of recesses.

8. The stiffener of claim 1, wherein the set of boundaries are arranged in a symmetrical configuration.

9. The stiffener of claim 1, wherein the at least one recess comprises:
- a first recess formed into a first linear boundary included in the set of boundaries; and
- a second recess formed into a second linear boundary that is included in the set of boundaries and positioned opposite the first linear boundary.

10. The stiffener of claim 9, wherein the first recess and the second recess are offset from one another relative to a symmetry axis that bisects the inner perimeter.

11. The stiffener of claim 10, wherein the at least one recess further comprises:
- a third recess formed into a third linear boundary included in the set of boundaries; and
- a fourth recess formed into a fourth linear boundary that is included in the set of boundaries and positioned opposite the third linear boundary.

12. The stiffener of claim 11, wherein the third recess and the fourth recess are offset from one another relative to the symmetry axis.

13. The stiffener of claim 1, wherein a width of the stiffener at the curved radius is less than a width of the stiffener outside of the curved radius.

14. An apparatus comprising:
- a substrate;
- an integrated circuit coupled to the substrate; and
- a stiffener that surrounds at least one dimension of the integrated circuit, the stiffener comprising:
  - an inner perimeter comprising a polygonal shape that includes:
    - sides of the polygonal shape creating a set of boundaries; and
    - at least one recess formed into at least one boundary of the set of boundaries; and
  - an outer perimeter that extends further outward from the integrated circuit than the inner perimeter,
- wherein the stiffener is positioned to align the at least one recess with at least one corner of the integrated circuit.

15. The apparatus of claim 14, wherein the stiffener further comprises material that:

extends between the inner perimeter and the outer perimeter; and provides structural support to the substrate to impede the substrate or the integrated circuit from warping.

16. The apparatus of claim 14, wherein the set of boundaries comprises at least four linear boundaries that collectively form the inner perimeter.

17. The apparatus of claim 14, wherein the set of boundaries comprises eight linear boundaries that collectively form the inner perimeter.

18. The apparatus of claim 14, wherein:

the at least one recess comprises a certain number of recesses; and the integrated circuit comprises a certain number of corners that is equivalent to the certain number of recesses.

19. The apparatus of claim 14, wherein the at least one recess comprises a curved radius.

20. A method comprising:

creating a stiffener comprising:

an inner perimeter comprising a polygonal shape that includes:

sides of the polygonal shape creating a set of boundaries; and at least one recess formed into at least one boundary of the set of boundaries, wherein the at least one recess comprises a curved radius; and an outer perimeter; and coupling the stiffener to a substrate of an integrated circuit such that the stiffener surrounds at least one dimension of the integrated circuit and the outer perimeter extends further outward from the integrated circuit than the inner perimeter.

* * * * *